United States Patent [19]
Pascente

[11] 3,758,793
[45] Sept. 11, 1973

[54] SYNCHRONOUS SWITCHING CIRCUIT

[75] Inventor: Joseph E. Pascente, Norridge, Ill.

[73] Assignee: Grigsby-Barton, Inc., Rolling Meadows, Ill.

[22] Filed: Mar. 3, 1972

[21] Appl. No.: 231,652

[52] U.S. Cl. .......................... 307/252 B, 307/252 UA
[51] Int. Cl. ........................................ H03k 17/72
[58] Field of Search .................. 307/252 B, 252 UA

[56] References Cited

UNITED STATES PATENTS

| | | | |
|---|---|---|---|
| 3,648,075 | 3/1972 | Mankovitz | 307/252 B |
| 3,328,606 | 6/1967 | Pinckaers | 307/252 B |
| 3,335,291 | 8/1967 | Gutzwiller | 307/252 B |

*Primary Examiner*—John Zazworsky
*Attorney*—William E. Anderson, A. Sidney Katz et al.

[57] ABSTRACT

A switching circuit for controlling the application of an a.c. source to a load employs a detector for selectively triggering a control thyristor at a zero-voltage crossing of the source and means for supplying a continuous latch current to the gate of the control thyristor during succeeding cycles of the a.c. source. The control thristor is employed to latch a switching thyristor which, in turn, applies the power from the a.c. source to the load. A common rectifier arrangement is provided to energize the detector as well as to supply the continuous latch current to the gate of the control thyristor.

18 Claims, 2 Drawing Figures

SYNCHRONOUS SWITCHING CIRCUIT

Figures 1, 2:
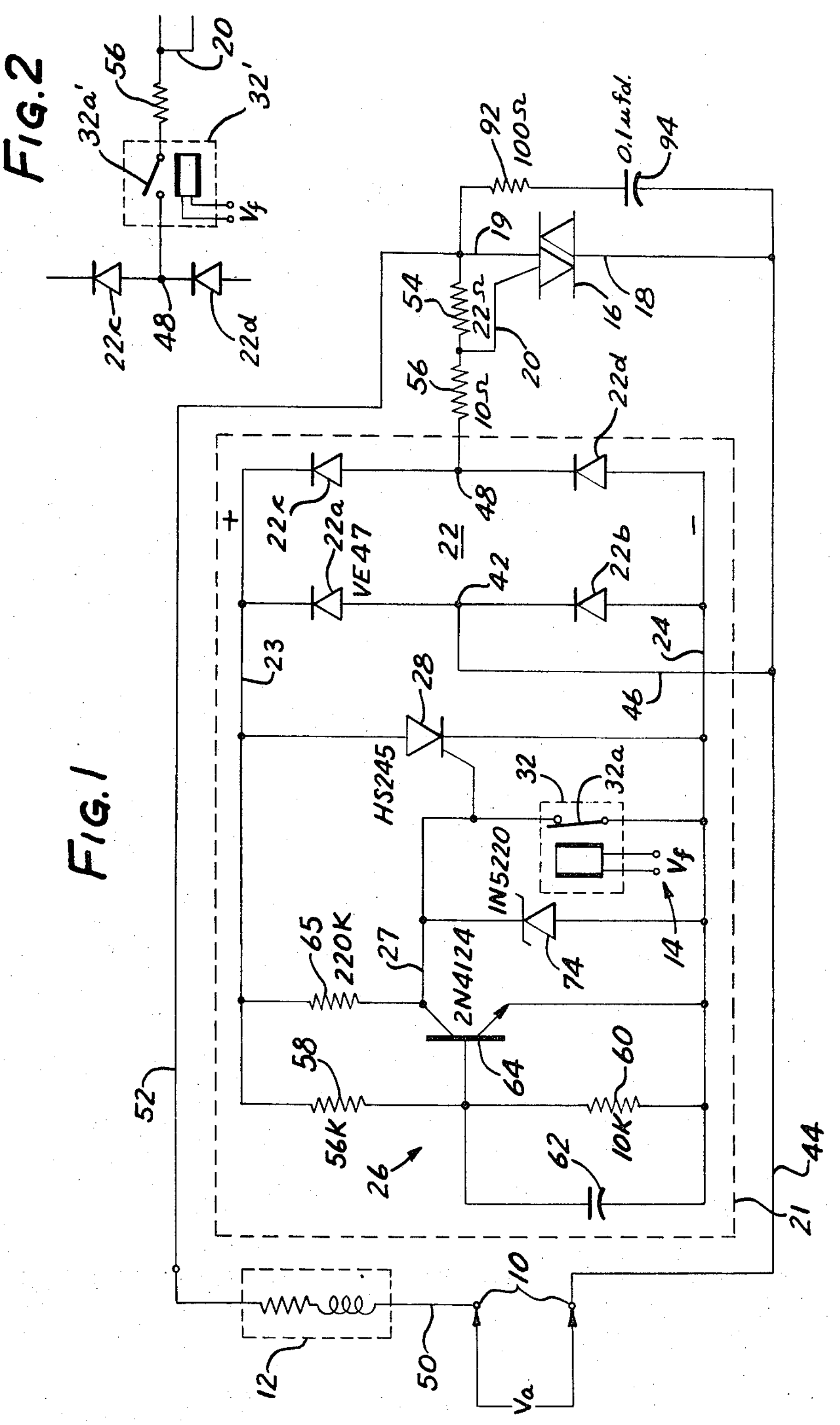

The present invention relates to zero-voltage a.c. switching circuits, and particularly to such circuits employing a triac or other thyristor element or elements arranged for bidirectional operation. The present application is a continuation-in-part of Ser. No. 76,132, filed Sept. 28, 1970, and now U.S. Pat. No. 3,668,422.

So-called zero-voltage or synchronous switching circuits generally employing thyristor elements for applying power to a load at a zero-voltage point, and for removing power from the load at a zero current point, are now well known. However, many such circuits as have been heretofore proposed have presented special problems when used with certain types of loads. In particular, these circuits have generally presented problems in switching highly reactive loads, as well as in switching resistive or reactive loads which draw either extremely high current or extremely low current relative to the normal ratings of economically practicable and available thyristors.

Various problems associated with the switching of reactive loads are discussed at some length in a number of available publications, such as the General Electic SCR Manual, 4th Edition, 1967. The problems associated with the switching of extremely high current loads arise because thyristors, such as triacs, which have high load terminal current ratings also generally require high gate currents for firing, and such gate currents have usually been obtained by providing additional amplification stages in the zero-voltage switching circuit, adding to the cost and complexity of the circuit. On the other hand, in the switching of low load currents, a problem also occurs in that the thyristor tends to become nonconductive, i.e., to turn off, when the load current is almost equal to the latching current rating of the thyristor.

Further, in many applications, for example, the triac of an a.c. zero-voltage switching circuit is required to turn on a load that initially draws a relatively low current, but which load may later increase to a high current. Since, typically, the higher the average load current rating of a thYristor, the higher will be the latch current, such a load would normally present serious problems in achieving zero-voltage switching with such heretofore existing circuits.

An improved zero-voltage switching circuit which may be utilized to switch either high or low current loads, or loads which draw varying currents from one extreme to the other, is disclosed in the previously identified parent application. That circuit employs a zero-voltage crossing detector for selectively triggering a control thyristor at a zero-voltage crossing of the source and means for supplying a continuous latch current to the gate of the control thyristor during succeeding cycles of the a.c. source. The control thyristor then latches a switching thyristor which, in turn, applies the power from the a.c. source to the load.

It is an object of the present invention to provide such an improved zero-voltage switching circuit of the above type which may also be utilized to switch either high or low current loads, or loads which draw varying currents from one extreme to the other, but with a circuit employing substantially fewer components, and being of relatively lower cost and complexity.

These and other objects and advantages of the present invention are more particularly set forth in the following detailed description, and in the accompanying drawing of which:

FIG. 1 is a schematic diagram of a zero-voltage switching circuit in accordance with an embodiment of the present invention; and FIG. 2 is a schematic diagram showing a modification of the circuit of FIG. 1 in accordance with another embodiment of the invention.

Generally, referring to FIG. 1 of the drawing, there is shown a switching circuit for controlling the application of an a.c. voltage source $V_a$ from line terminals 10 to a load impedance 12, illustrated as having resistance and inductive reactance, in response to a control command signal $V_f$ applied to control terminals 14 for actuation and deactuation of the circuit. Switching thyristor means, illustrated as triac 16, having a pair of load terminals, shown as anode 18 and cathode 19 (by analogy to SCR convention), and a control gate terminal 20, has its load terminals 18 and 19 connected in series with the a.c. source (at line terminals 10) and the load 12. The triac 16 is switchable from a normally nonconductive or "off" state to a conductive or "on" state by an appropriate firing signal applied between the thyristor gate terminal 20 and one of its load terminals, with proper potential applied across both load terminals. To remain in the conductive state without further firing or gate input, such thyristors must generally have a current flowing between their load terminals which is at least as great, and preferably greater, than the rated latch current of the thyristor. Otherwise, the thyristor will be "starved off" and will return to its normally nonconductive state. To prevent this from occurring, circuit means to be hereinafter described provide positive latching of the thyristor by effectively coupling its gate terminal to the line voltage applied to the appropriate thyristor load terminal, such as its anode.

Circuit means 21 for operating the switching triac 16 comprises rectifier means 22 for deriving a rectified d.c. voltage across circuit leads 23 and 24 from the a.c. source voltage $V_a$; means, illustrated as synchronous detector 26, for providing an output signal on lead 27 indicative of a zero-voltage crossing of the a.c. source voltage $V_a$; and a control thyristor, illustrated as silicon controlled rectifier (SCR) 28, having its anode and cathode load terminals respectively connected across circuit leads 23 and 24, and which is selectively responsive to the application of the zero-voltage detection signal supplied to its gate terminal for triggering the SCR to its conductive state. The operating circuit 21 is coupled to the triac 16 through the rectifier means 22 which also functions as a means for steering the current in the appropriate manner to achieve the desired switching operation, as will be hereinafter described. Additionally, the rectifier means 22 supplies a continuous gate or latch current to the SCR 28 during all succeeding cycles of the source voltage $V_a$, once the SCR 28 is triggered by the zero-voltage detection signal from the detector 26 so that positive latching of the SCR in its conductive state is assured. Control switching means 32, illustrated as a normally closed contact relay, is responsive to the command control signal $V_f$ for selectively enabling or disabling the application of the zero-voltage detection signal and the continuous gate current to the gate of the SCR 28, resulting in the respective actuation or deactivation of the circuit.

Consequently, in the illustrated embodiment, the command signal voltage $V_f$ applied to the control terminal 14, regardless of when applied, causes the triac 16 to turn on at the next zero-voltage crossing of the a.c. source, and thus results in the power being applied to the load 12 at that time. Removal of the command signal voltage $V_f$ (i.e., $V_f = 0$) at any time causes the triac 16 to turn off when the next succeeding cycle of load current goes to zero (or becomes less than the minimum holding current rating of the triac).

More particularly, the control switching means 32 preferably comprises a d.c. reed relay of the normally closed, single pole, single throw type having its switch contacts 32*a* connected in shunt with the gate input of the SCR 28, i.e., across the gate and cathode terminals. Thus, when the command signal voltage $V_f$ is zero, the input to the gate of control SCR 28 is disabled; while when the signal voltage $V_f$ is at the rated relay voltage, the normally closed contacts 32*a* open and the SCR 28 is enabled for triggering. The current for the operating circuit 21 is derived from the rectifier means 22 which comprises a full-wave rectifier bridge formed by diodes 22*a* through 22*d*, and provides full-wave rectified d.c. pulses across the leads 23 and 24. These leads are respectively connected to the + and − output terminals of the bridge, as shown. The a.c. line voltage $V_a$ is applied to one input terminal 42 of the bridge through a direct conductive connection via a.c. reference leads 44 and 46, and to the opposite input terminal 48 of the bridge via a.c. line 50, load 12, and load lead 52, as well as through coupling resistor 54 (between the gate and cathode of the triac 16) and the current limiting resistor 56. The resulting full-wave rectified voltage across leads 23 and 24 is applied across the anode and cathode of the SCR 28 and across the synchronous detector circuit 26.

The synchronous detector circuit 26 comprises a voltage divider formed by resistors 58 and 60 which is connected across circuit leads 23 and 24, and thus has the full-wave rectified voltage applied thereto. A capacitor 62 is connected in shunt with resistor 60, and the divided voltage across the parallel combination is used to drive a transistor circuit by being applied to the base of an NPN transistor 64. The emitter of the transistor 64 is connected directly to the lead 24 which forms the common or reference lead of the operating circuit 21. The collector of the transistor 64 is connected to the positive lead 23 through a collector resistor 65 so that the full-wave rectified voltage is also applied across the collector-emitter circuit of the transistor. A Zener diode 74 is connected in shunt with the collector and emitter of transistor 64 as a protective device for preventing excessive voltages from being applied thereacross.

Consequently, assuming for the time being that the relay 32 is energized and thus contact 32a is opened, the divided full-wave rectified voltage appearing across the base-emitter circuit of the transistor 64 normally forward biases the base-emitter junction of the transistor for conduction, except near the zero-voltage point of the full-wave rectified voltage whereat the transistor 64, according to its inherent characteristics, will be nonconductive. This cutoff voltage may typically be about 0.7 volts, so the transistor 64 will be nonconductive symmetrically with respect to time about each zero-voltage crossing. Thus, the collector-emitter circuit of the transistor 64 is capable (assuming other circuit conditions would be satisfied) of conducting during the major portion of each half cycle of the source voltage, and is not capable of conducting during the short time interval at each half cycle point of the zero-voltage crossing when the base-emitter voltage falls below the cutoff voltage of the transistor.

The zero-voltage detector signal is taken across the collector and emitter of the transistor 64. This signal is essentially zero when the transistor 64 is conducting, but is at a positive voltage (limited by the Zener diode 74) when the transistor 64 is not conducting. Thus, at the initial zero-voltage crossing of the a.c. source when the transistor 64 becomes nonconductive, the voltage on detector output lead 27 will go from about zero to some positive low voltage (e.g., from 6 to 16 volts, depending on the particular components employed in the circuit) which will be applied to the gate of SCR 28. Simultaneously, the rectified voltage across the anode and cathode of the SCR 28, which is in phase with the line voltage, will be increasing to provide an anode voltage of proper polarity and magnitude so that the SCR 28 will become conductive in response to the voltage pulse on lead 27. Once the SCR 28 becomes conductive, however, it shorts out the voltage across the operating circuit leads 23 and 24 which disables the detector circuit 26 and effectively results in the collector resistor 65, connected between the gate and anode of the SCR 28. latching the SCR into a conductive condition. This provides a positive latch for all succeeding cycles of source voltage $V_a$, until the command voltage $V_f$ is returned to zero.

When the SCR 28 shorts out leads 23 and 24, the voltage across the voltage divider of the synchronous detector circuit 26 goeS to a value actually determined by the inherent forward conducting characteristics of the SCR, which is approximately, but greater than, zero, such as typically about 1 volt, thereby removing the base drive from the transistor 64. The zero detector output pulse which initiated the firing of the SCR 28 degrades as the transistor 64 is cutoff, the current supplied from rectifier bridge 22 through collector resistor 65 and the SCR provides the positive latching action of the SCR 28, transistor 64 being then nonconductive so that the gate and anode of SCR 28 are merely resistively coupled together by the collector resistor. This action can occur on any half cycle of the a.c. source and is independent of whether the a.c. source half cycle is in the first half or second half of the cycle.

With the control SCR 28 conducting, the rectifier bridge 22 also functions as a current steering means and provides a direct conductive connection from the current limiting resistor 56 to the a.c. line reference lead 44, thus, in effect tying the gate 20 of the triac 16 to its anode, assuring that the triac will snchronously switch with the a.c. source voltage. It may be noted that one of the most simple and positive action circuits for utilizing triacs (as well as SCR's) as static switches comprises a resistive coupling between the triac (or SCR) gate terminal and its anode.

More specifically, when the SCR 28 is in its conductive state, the triac gate current path is defined by lead 50 from one of the line terminals 10, through the load 12, lead 52, resistors 54 and 56, rectifier bridge 22, SCR 28 and back to rectifier bridge 22, and then through lead 46 to the other line terminal 10 via lead 44. The bridge 22 steers the current appropriately so that when the lead 52 is positive and lead 44 is negative, the current path is through diode 22*c*, SCR 28, and diode 22*b*. When lead 52 is negative and lead 44 is positive, the current path is formed by diode 22a, SCR 28 and diode 22d. Thus, it can be seen that the resistor 56 has a direct conductive path to the anode 18 of the triac 16 so long as the SCR 28 remains conductive to provide a resistive coupling between the gate and anode terminals.

During the normal conduction and synchronous switching of the triac 16 substantially the full line voltage is applied to the load 12 through the triac. During the half cycles of conduction of the triac, a voltage drop of typically about 1 volt appears across the triac load terminals. For the inductive load illustrated in the drawing, the power will be applied across the load with the current lagging the voltage in the usual manner as will be determined by the particular characteristics of the load.

Now, when the signal command voltage $V_f$ is returned to zero, the reed relay contacts 32a close and thereby shunt the gate of the SCR 28 to its cathode so that the SCR 28 will become nonconductive when the current magnitude drops below its "holding current" rating. The SCR 28 will generally remain conductive for approximately the remaining portion of that half cycle, after which time it becomes nonconductive and the full-wave rectified voltage produced by the rectifier bridge 22 will again appear across operating circuit leads 23 and 24. The full-wave rectified voltage will thus be applied across the base and collector circuits of the transistor 64, but the transistor will remain essentially nonconductive due to the normally closed contact 32a shunting the transistor collector and emitter terminals. The rectified voltage will appear across the collector resistor 65, and the SCR 28 will remain nonconductive with its gate shunted to its cathode. With the gate-anode circuit of the triac 16 now being opened by the nonconductive state of the SCR 28, the triac will become nonconductive again at approximately the next zero current point, which may coincide with the zero-voltage point for resistive loads, or may differ in phase for reactive loads. The lagging or leading load currents that may be produced by reactive loads do not prevent the circuit of the present invention from operating in synchronism with the source voltage.

A very small residual current will generally continue to flow through the load even when the triac 16 is off, and this current is drawn through the bridge 22 by the synchronous detector 26 in its normal quiescent condition; however, this current is negligible in most applications and is of no concern. Removal of the load 12, however, will prevent any current flow to the circuit.

Also, the circuit of FIG. 1 may be modified by moving the control switching means from the gate of the SCR 28 to the gate of the triac 16, which will essentially eliminate the leakage current through the load when the control switching means opens the triac gate circuit. This is illustrated in FIG. 2 which shows a relay 32' (such as a reed relay) having normally open contacts 32a' serially connected between limiting resistor 56 and input terminal 48 of the rectifier bridge 22. The normally closed relay 32 between the SCR gate and cathode would then not be employed. Thus, upon the application of the control signal voltage $V_f$ to the coil of relay 32', the contacts 32a' close and the transistor 64 becomes conductive while the SCR is nonconductive (assuming that the relay was closed at some point other than at a zero-voltage crossing of the line voltage $V_a$). When the line voltage goes to zero, the voltage across circuit leads 23 and 24 also goes to zero, and a pulse is produced on detector output lead 27 which is supplied to the SCR gate in the manner hereinbefore described. The SCR thus becomes conductive on the first zero voltage crossing of the source after the relay contacts 32a' are closed.

When the control signal voltage $V_f$ is removed, the contacts 32a' open the triac gate circuit in a positive manner, and the triac turns off when the load current drops below the triac hoding current rating. Controlling the triac through its gate circuit, as shown in FIG. 2, results in obtaining the full *dv/dt* rating of the triac; while controlling the triac through the gate circuit of the SCR, as shown in FIG. 1, may tend to somewaht reduce the effective *dv/dt* characteristic of the triac below its full rated value because of the continuous leakage current flowing through the circuit.

A series commutation circuit formed by resistor 92 and capacitor 94 is connected in shunt with the triac 16 to minimize the *dv/dt* across the triac load terminals, and is in accordance with conventional practice for this purpose.

The component parameters and values specified in the circuit of the drawing provide satisfactory operation for a line voltage of approximately 220 volts. Satisfactory operation at other voltages, such as 20 volts, 420 volts, or at more than one voltage, may be achieved by suitably varying the component values in accordance with well known circuit design techniques.

Thus, there has been described an improved synchronous switching circuit which has a positive latching feature, and maintains the switching thyristor or thyristors conductive and operating synchronously with the line voltage for high current loads as well as for low current loads less than the latching current and even less than the minimum holding current of the device. The circuit will also operate effectively with reactive loads as has been described. Moreover, as compared to the circuits illustrated in the aforesaid parent application, it can be seen that the present circuit eliminates the need for the separate rectifier arrangement and additional capacitor to provide the supply of current to the gate of the silicon controlled rectifier after it is triggered. This function is accomplished in the present circuit by the full-wave rectifier bridge 22 in addition to its other functions. Thus by utilizing this rectifier arrangement to provide all of the various functions previously discussed, the complexity, number of components, and cost of the overall circuit are reduced without any loss of attendant function. The illustrated circuit also has fewer terminal connections than the circuits illustrated in the parent application, since one side of the line is connected to the load apart from the device containing the switching circuit.

Although the presently illustrated circuit employs a triac to switch the line voltage to the load, it is understood that a pair of inverse-parallel connected SCR's may be substituted in the manner illustrated in FIG. 3 of the aforementioned parent application. Also, although the present circuit of FIG. 1 employs a reed switch connected in shunt with the gate of the control SCR 28, a series connected reed switch may be alternatively employed in the manner illustrated in said parent application, preferably with a resistor connecting the gate to the cathode of the SCR. Alternatively, switching devices other than a reed switch may be employed, but it is preferable that such a switching device provide good isolation and thus may desirably be in the form of an electro-optical device, such as a photo-diode or phototransistor switch, or the like, used with a light source such as a light emitting diode, or any conventional lamp.

It is of course understood that although a preferred embodiment of the present invention has been illustrated and described, various modifications thereof will be apparent to those skilled in the art; and accordingly, the scope of the present invention should be defined only by the appended claims and equivalents thereof.

Various features of the invention are set forth in the following claims.

What is claimed is:

1. A switching circuit for controlling the application of an a.c. source to a load, comprising switching thyristor means having a pair of load terminals and a control terminal and having a bidirectional switching characteristic, means coupled to said load terminals for connecting the a.c. source to the load, control thyristor means having a pair of load terminals and a control terminal, detector means for providing pulses indicative of the zero-voltage crossings of said a.c. source, current supply means including resistance means connecting one of said control thyristor load terminals to the control terminal of said control thyristor, means for selectively applying at least one of said pulses to the control terminal of said control thyristor means for triggering the same and for permitting current flow thereto from said current supply means through said resistance means for succeeding cycles of said a.c. source once said control thyristor means becomes conductive, and circuit means for coupling the control terminal of said switching thyristor means to one of said load terminals thereof through the load terminals of said control thyristor means, and including means coupled to said detector means for driving said detector means when said control thyristor means is nonconductive and for serving as said current supply means when said control thyristor means is conductive.

2. The circuit of claim 1 wherein said coupling circuit means comprises rectifier means for appropriately steering currents from the control terminal of said switching thyristor means, through said control thyristor means, to said one load terminal of said switching thyristor means for each polarity of the a.c. source.

3. The circuit of claim 2 wherein said rectifier means provides a full-wave d.c. voltage for operating said detector means.

4. The circuit of claim 3 wherein said detector means comprises transistor means responsive to said rectified d.c. voltage to be enabled to provide an output pulse under the condition that said full-wave d.c. voltage is below the cut-off level of the transistor means, said output pulse being indicative of a zero-voltage crossing of said source.

5. The circuit of claim 4 wherein said rectified d.c. voltage is applied to the base circuit and the emitter-collector circuit of said transistor means, said emitter-collector circuit including a series resistor connected therein, and said emitter-collector circuit being connected across the output terminals of said rectifier means so that said output pulse is generated at one end of said resistor under the condition that said transistor means becomes nonconductive.

6. The circuit of claim 5 wherein said control thyristor means comprises a silicon controlled rectifier having anode and cathode load terminals and a gate control terminal, said anode and cathode being connected across the output of said rectifier means and the gate being responsively coupled to said output pulses from said transistor means so that the silicon controlled rectifier will be triggered to its conductive state at the zero-voltage crossing of said source and will be latched in said conductive state by said resistor coupled between the gate and anode of said controlled rectifier.

7. The circuit of claim 6 comprising a selectively operable, normally closed switch connected between the gate and cathode of the silicon controlled rectifier, normally disabling the operation of said detector means and said silicon controlled rectifier, but enabling said operation upon being opened so that the controlled rectifier will be triggered into conduction by the first output pulse from the detector means.

8. The circuit of claim 2 wherein said rectifier means has one input connected to said one load terminal of said switching thyristor means, and the other input resistively coupled to the control terminal of said switching thyristor means, said one load terminal being connected to one a.c. source terminal, and said control terminal being resistively coupled to a further terminal for connection to the other a.c. source terminal through the load.

9. The circuit of claim 1 wherein said means for selectively applying at least one of said pulses to the control terminal of said control thyristor means comprises a switch connected in said circuit means for selectively closing and opening a circuit for coupling the control terminal of said switching thyristor means to one of said load terminals thereof through the load terminals of said control thyristor means.

10. A switching circuit for controlling the application of an a.c. source to a load, comprising switching thyristor means having a pair of load terminals and a control terminal and having a bidirectional switching characteristic; circuit means coupled to said load terminals for connecting the a.c. source to the load; control thyristor means having a pair of load terminals and a control terminal; detector means for providing a signal indicative of a zero-voltage crossing of said a.c. source; means for, at will, enabling said control thyristor means to be responsive to said signal so that it is triggered into a conductive state at a zero-voltage crossing of the source; means for supplying current to the control terminal of said control thyristor means through a resistance means coupling the control terminal to one load terminal thereof for succeeding cycles of said a.c. source after said control thyristor means becomes conductive; and means for coupling the control terminal of said switching thyristor means to one of said load terminals thereof through the load terminals of said control thyristor means to maintain said switching thyristor means conductive, said last named means including in common therewith said means for supplying current to the control terminal of said control thyristor means through said resistance means.

11. The circuit of claim 10 wherein said enabling means comprises a switch for selectively closing and opening a circuit of said coupling means.

12. A synchronous switching circuit for controlling the application of an a.c. source to a load, comprising a triac having an anode, cathode and gate; circuit means coupled to the triac anode and cathode for switching the a.c. source to the load when the triac is in its conductive state; a silicon controlled rectifier having an anode, cathode and gate; a rectifier circuit having four diodes interconnected in a general bridge arrangement to provide a pair of input terminals for the application of an a.c. voltage thereto and a pair of output terminals to provide a full-wave d.c. voltage therefrom; conductive means for coupling the a.c. source across said pair of input terminals, for coupling the triac gate to one of said input terminals, and for coupling the other of said input terminals to the triac anode; said pair of output terminals being connected across the anode and cathode of said silicon controlled recifier and poled with respect to the diodes of said rectifier circuit so that a direct conductive path is provided between the gate and anode of the triac through the silicon controlled rectifier when the latter is in its conductive state; a transistor circuit having base input means connected across said pair of output terminals for rendering the transistor non-conductive when the full-wave d.c. voltage is below the cut-off level of the transistor, said cut-off level being sufficiently low so that the periods of nonconduction are indicative of the zero-voltage crossings of the a.c. source; means coupled to the output of said transistor circuit and to the gate of the silicon controlled rectifier for selectively enabling the silicon controlled rectifier to be triggered into a conductive state at a zero-voltage crossing of the a.c. source; and means coupled to the gate of the silicon controlled rectifier for supplying a latching signal thereto for succeeding cycles of the a.c. source after said silicon controlled rectifier becomes conductive, said last named means comprising a resistor connected between the gate and anode of the silicon controlled rectifier.

13. The circuit of claim 10 wherein saud means coupled to the output of said transistor circuit and to the gate of the silicon controlled rectifier comprises switching means for normally shunting the gate and cathode of the silicon controlled rectifier.

14. The circuit of claim 10 wherein said resistor is also connected in the collector circuit of said transistor.

15. A switching circuit for controlling the application of an a.c. source to a load, comprising switching thyristor means having a pair of load terminals and a control terminal and having a bidirectional switching characteristic; circuit means coupled to said thyristor load terminals for connecting the a.c. source to the load; an operating circuit for said switching thyristor means comprising a full-wave rectifier circuit having input and output terminals, a control thyristor having anode, cathode and gate terminals, and a transistor zero-voltage crossing detector circuit; means conductively connecting the output terminals of the rectifier circuit across the anode and cathode terminals of the control thyristor, the load terminals of the transistor circuit, and the control terminal of the transistor circuit; means for conductively connecting the output load terminal of the transistor circuit to the gate of the control thyristor; the control terminal of the switching thyristor means being coupled to one input terminal of the rectifier circuit and resistively coupled to one load terminal of said switching thyristor means, and the other load terminal of said switching thyristor means being connected to the other input terminal of the rectifier circuit; and means for selectively enabling the control terminal of said switching thyristor means to be coupled to said other load terminal thereof through the anode and cathode of said control thyristor so as to permit the latching of said switching thyristor means in a conductive state.

16. The circuit of claim 15 wherein said enabling means comprises a selectively operable, normally closed switch connected between the gate and cathode of the control thyristor.

17. The circuit of claim 15 wherein said enabling means comprises a selectively operable, normally open switch connected between said control terminal of the switching thyristor means and said other load terminal thereof.

18. The circuit of claim 15 wherein said enabling means comprises a selectively operable, normally open switch connected between said control terminal of the switching thyristor and said one input terminal of said rectifier circuit.

* * * * *